(12) United States Patent
Chen et al.

(10) Patent No.: US 7,494,357 B2
(45) Date of Patent: Feb. 24, 2009

(54) SOCKET WITH LATCHING EQUIPMENT

(75) Inventors: Ming-Yue Chen, Tu-Cheng (TW);
Hsiu-Yuan Hsu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/012,619

(22) Filed: Feb. 4, 2008

(65) Prior Publication Data

US 2008/0186659 A1 Aug. 7, 2008

(30) Foreign Application Priority Data

Feb. 2, 2007 (CN) .......................... 200710019697

(51) Int. Cl.
*H01R 13/62* (2006.01)

(52) U.S. Cl. .................................... 439/259
(58) Field of Classification Search ................. 439/259, 439/70, 71, 68, 342, 73
See application file for complete search history.

(56) References Cited

U.S. PATENT DOCUMENTS 7,121,858 B2  10/2006  Chen

*Primary Examiner*—Javaid Nasri
(74) *Attorney, Agent, or Firm*—Wei Te Chung

(57) ABSTRACT

A socket, adapt for electrically connecting a semiconductor package to a printed circuit board, comprises an insulating base receiving a plurality of contacts, a floating board assembled to the insulating base for supporting the semiconductor package, a cover movably mounted to the insulating base and being movable on a top-to-bottom direction and a pair of latching members movably assembled to the cover. Each latching member has two ends, each end being formed with three pivots, and the cover correspondingly defines a plurality of grooves. When the cover moves downwardly, the pivots of the latching members will slide along the grooves of the cover to make the latching member rotate from a close position to an open position relative to the insulating base.

7 Claims, 9 Drawing Sheets

SOCKET WITH LATCHING EQUIPMENT

BACKGROUND OF THE INVENTION

1. Field of the Invention

The present invention relates to a socket, especially to a socket for electrically connecting a semiconductor package to a printed circuit board.

2. Description of the Related Art

U. S. Pat. No. 7,121,858 discloses a connector for a semiconductor package, referring to FIGS. 1 and 2, the connector of U. S. Pat. No. 7,121,858 comprises a main body 80 with an inserting portion 804 in a center thereof, an upper mounting portion 81 and a lower mounting portion 82, a locking portion 86 pivotally assembled to the upper mounting portion 81, an actuator 84 adapted for actuating the locking portion 86 and an engaging portion 85 located upon the lower mounting portion 82 and received in the actuator 84. The inserting portion 804, the upper mounting portion 81 and the lower mounting portion 82 are correspondingly formed with a plurality of inserting holes for receiving contacts (not shown). The actuator 84 has a latching portion 842 which can move along a slot 802 defined on the main body 80 in a top-to-down direction, springs (not shown) are located on four corners of the main body 80 to support the actuator 84, when the actuator 84 is pressed downwardly and actuates the locking portion 86 is in an opening position, so that the semiconductor package can be put into the connector. After that, the actuator 84 is forced by the springs to move upwardly and actuates the locking portion 86 to a close position to lock the semiconductor package. The engaging portion 85 has a plurality of bottom edges 850, 852 on four sides thereof to form a frame with a size approximately same with that of the semiconductor package, by this way, the bottom edges 850, 852 can latch edges of the semiconductor package and retain the semiconductor package in the connector, so the semiconductor package is well positioned.

However, the connector adopts lever equipments to actuate the locking portion to fasten the semiconductor package, so the configuration of the connector is complex which is disadvantageous for assembly and use of the connector.

Hence, an improved socket is required to overcome the disadvantages of the prior art.

SUMMARY OF THE INVENTION

An object of the invention is to provide a socket with a latching equipment.

To achieve the above-mentioned object, a socket comprises: an insulating base receiving a plurality of contacts; a cover mounted to the insulating base, the cover being movable in a top-to-bottom direction relative to the insulating base and defining at least one arc groove; a latching equipment movably assembled to the cover and defining an open position and a close position relative to the insulating base, the latching equipment having at least one pivot, when the cover moving downwardly, the pivot sliding along the arc groove of the cover to make the latching equipment rotate from the close position to the open position.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
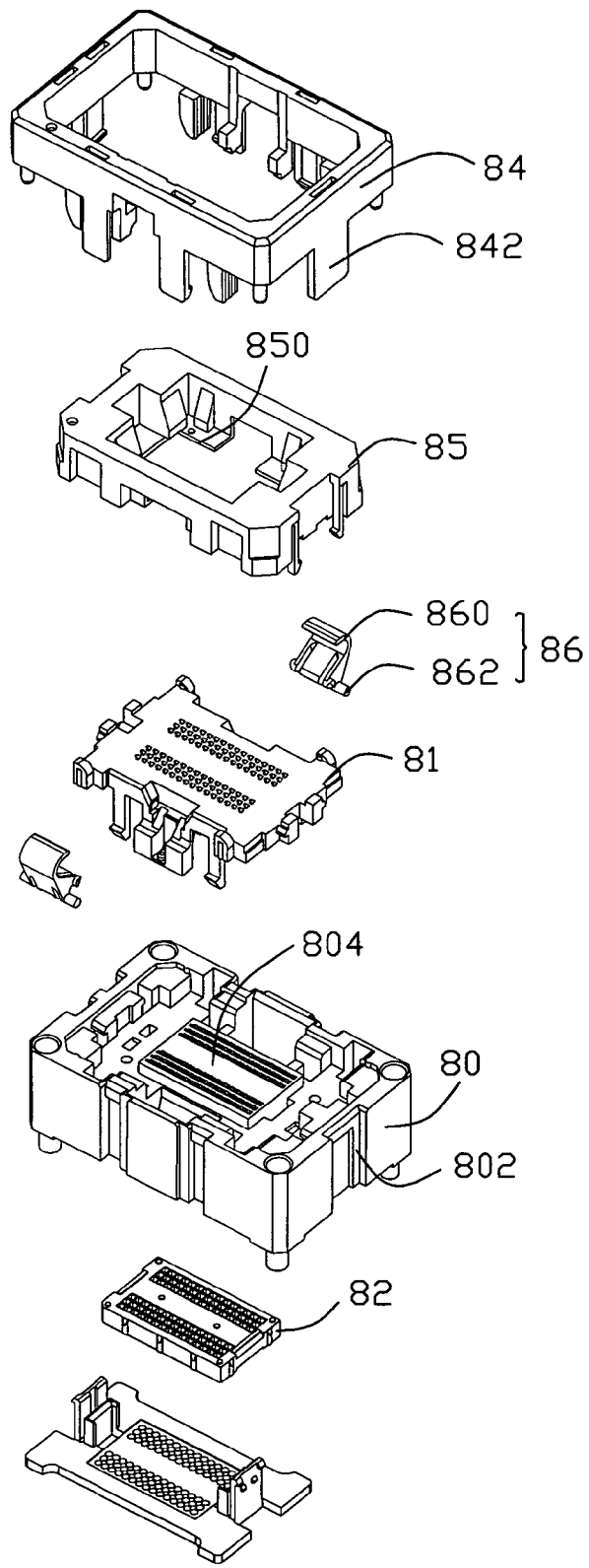
FIG. 1 is an exploded, perspective view of a socket of related art.
Figure 2:
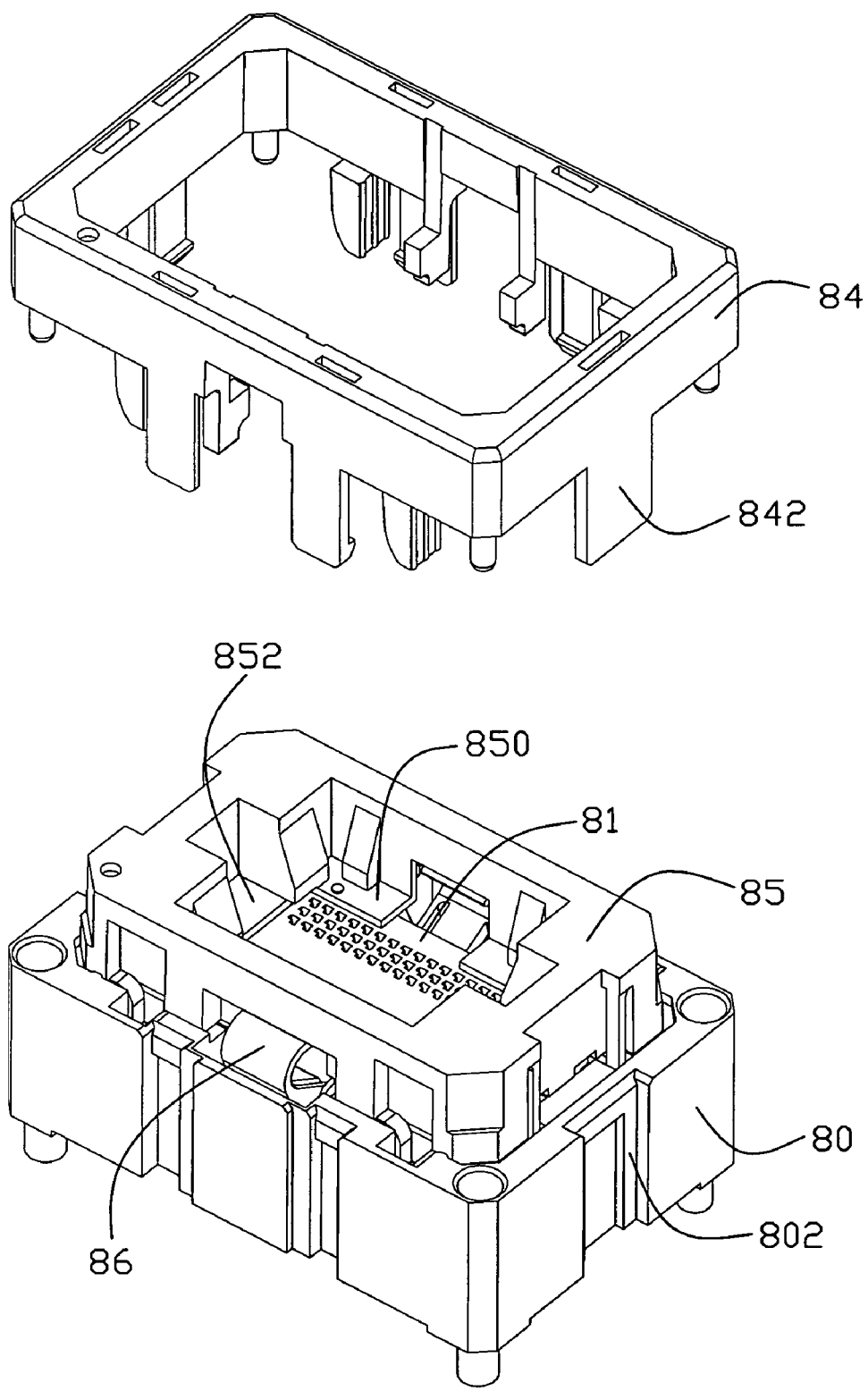
FIG. 2 is a partially assembled, perspective view of the socket shown in FIG. 1.

Reference will now be made in detail to the preferred embodiment of the present invention.

Referring to FIGS. 3-9, a socket 1, for electrically connecting a semiconductor package 10 to a printed circuit board (not shown), comprises an insulating base 2 accommodating a plurality of contacts (not shown), a floating board 3 assembled to the insulating base 2, a cover 4 linked to the insulating base 2 and being movable in a top-to-bottom direction relative to the insulating base 2, a plurality of springs 5 located between the insulating base 2 and the cover 4 to force the cover 4 to upwardly move, and a latching equipment 6 rotatably assembled to the cover 4 and defining a opening position and a close position relative to the insulating base 2.

Figure 3:
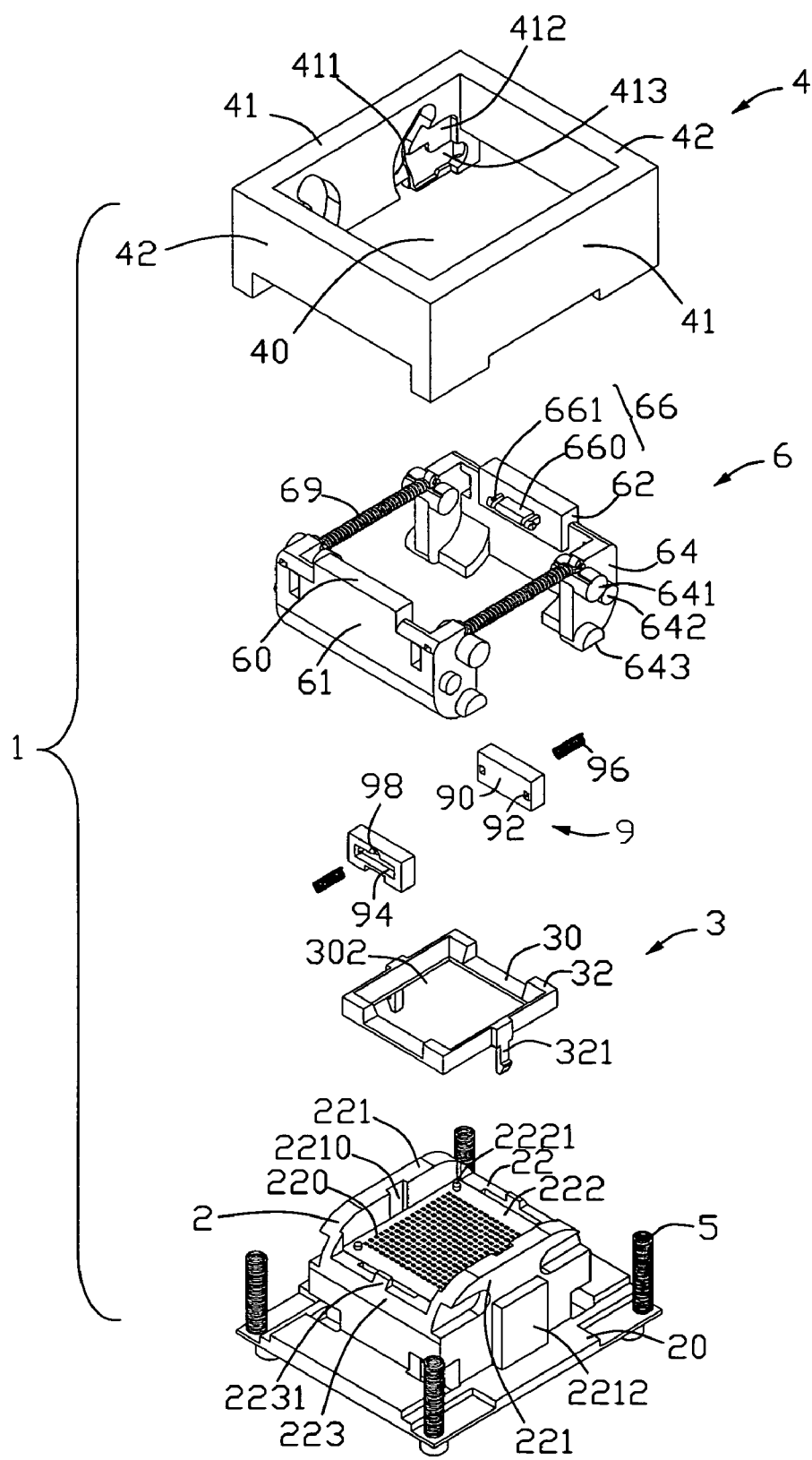
FIG. 3 is a partially exploded, perspective view of a socket in accordance with an embodiment of the present invention.

Referring to FIG. 3, the insulating base 2 has a bottom wall 20, a plurality of supporting portions (not shown) on four corners of the bottom wall 20 and a main body 22 upwardly extending from the bottom wall 20. The springs 5 are respectively located on the supporting portions (not shown). The main body 22 is formed with a center part 222 in a center thereof, which defines a plurality of channels 220 aligned in a matrix. A plurality of contacts (not shown) are received in the channels 220, and each contact has two ends, one end downwardly extending out of the bottom wall 20 of the insulating housing 2 to electrically contact with the printed circuit board (not shown), and the other end upwardly extending and having a contacting portion (not shown) to contact with the semiconductor package 10. The main body 22 has a pair of first sidewalls 221 and a pair of second sidewalls 222 around the center part 222. The first sidewall 221 defines a receiving slot 2210 recessed from a top surface thereof and a position block 2212 outwardly protruding therefrom, the second sidewall 223 has a bulge 2231 on a top edge thereof. The center part 222 has four pins 2221 on four corners thereof.

The floating board 3 is set upon the center part 222 of the insulating base 2 and comprises a bottom rim 30 and a plurality of side rims 32, which together form a loading space 302 for the semiconductor package 10. Two of the side rims 32 respectively have an upwardly extending latching claw 321 for engaging with the corresponding receiving slot 2210 of the insulting base 2. The bottom rim 30 defines a plurality of holes (not shown) to receive the pins 2221 of the insulating base 2, so that the floating board 3 is movably assembled to the insulating base 2 and is prevented from dropping from the insulating base 2.

Figure 4:
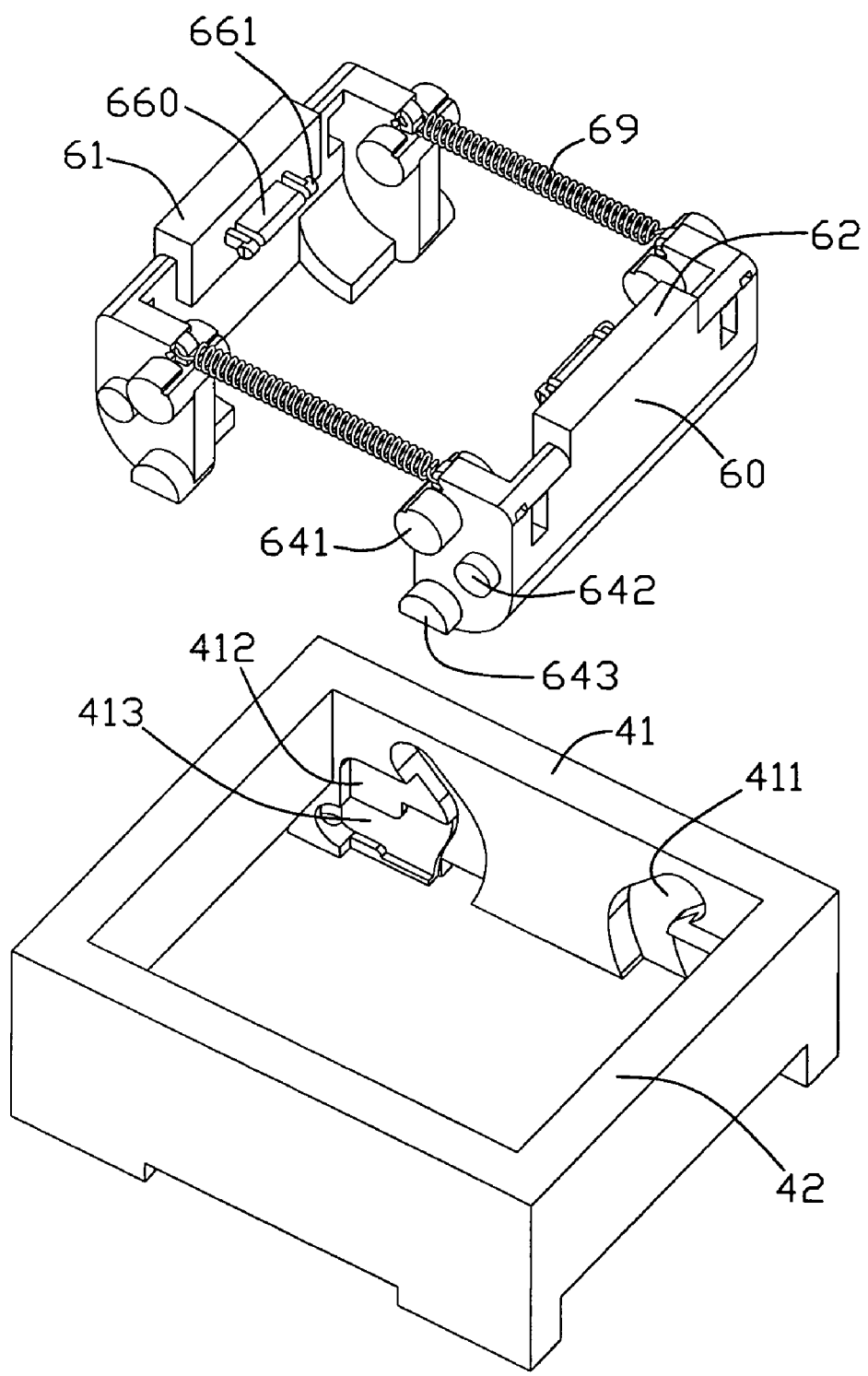
FIG. 4 is a perspective view of a cover and a pair of latching members of the socket.
Figure 5:
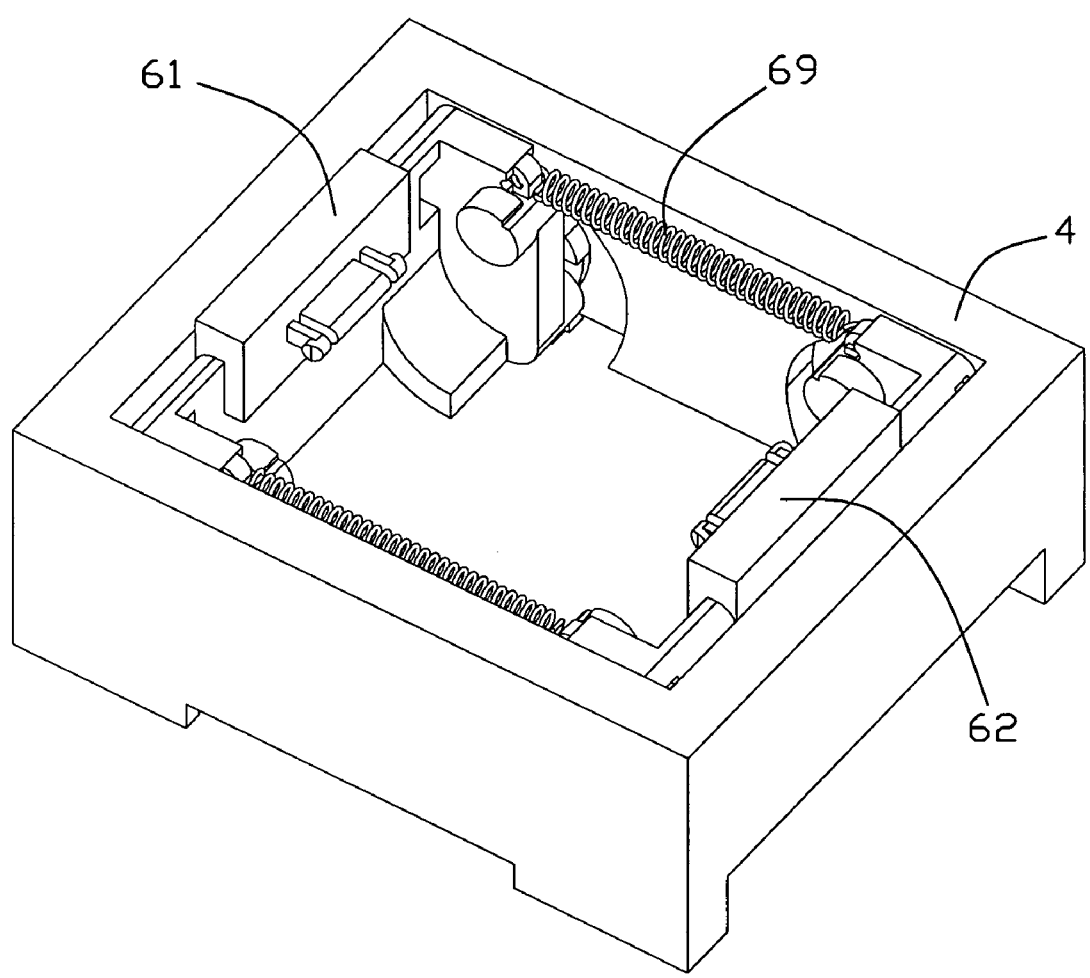
FIG. 5 is similar with FIG. 4, but showing the latching members assembled to the cover.
Figure 6:
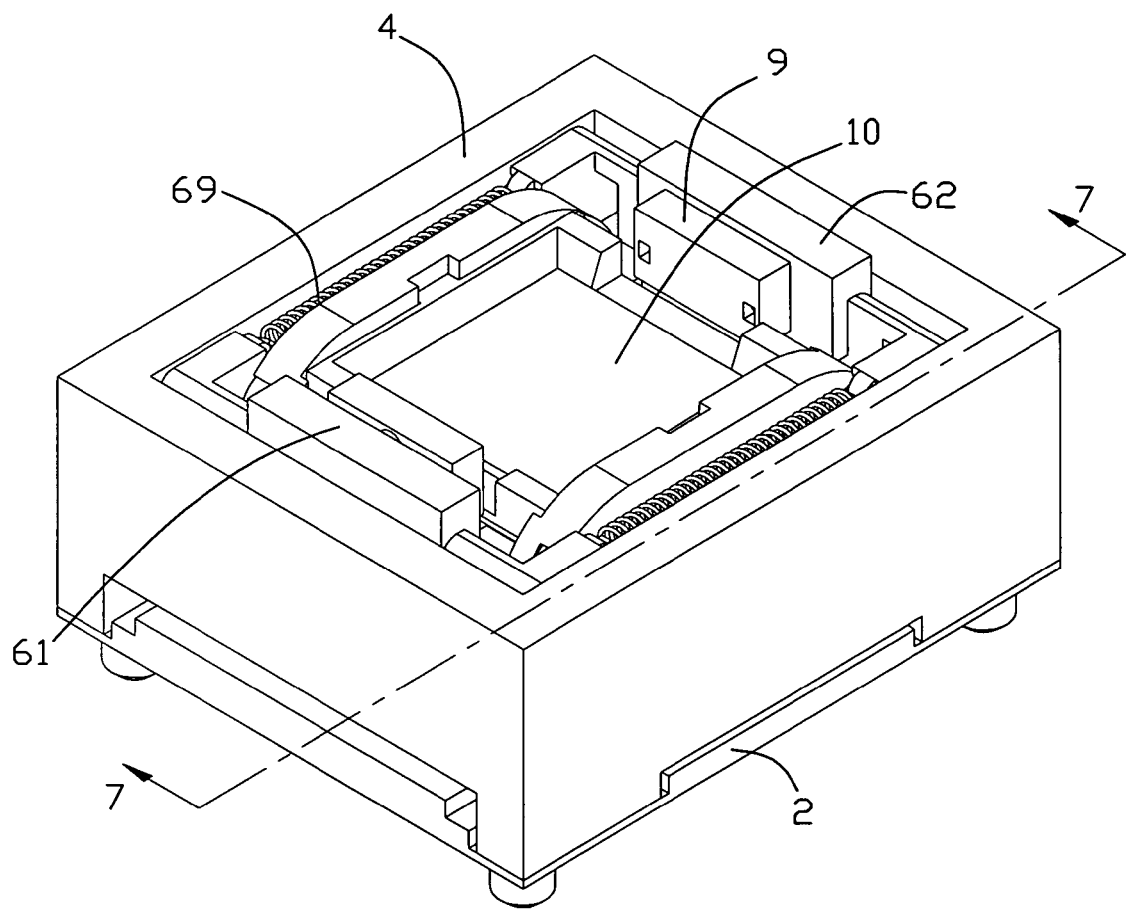
FIG. 6 is an assembled, perspective view of the socket in accordance with an embodiment of the present invention, wherein the latching members are at an open position.
Figure 7:
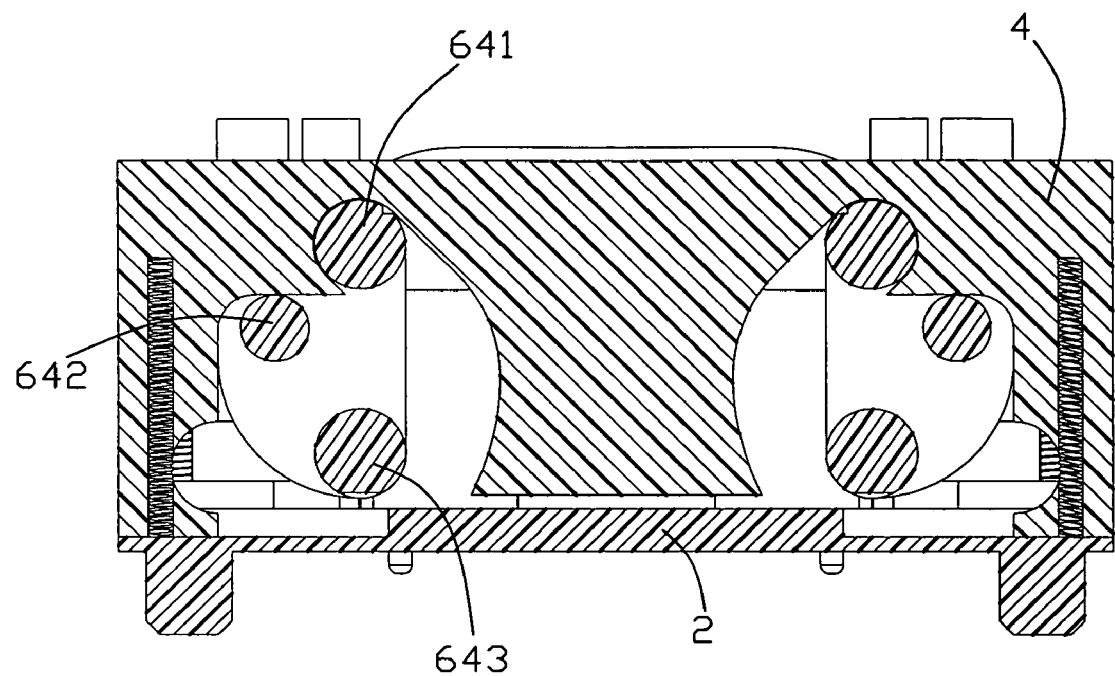
FIG. 7 is a section view, taken along line 7-7 in FIG. 6.
Figure 8:
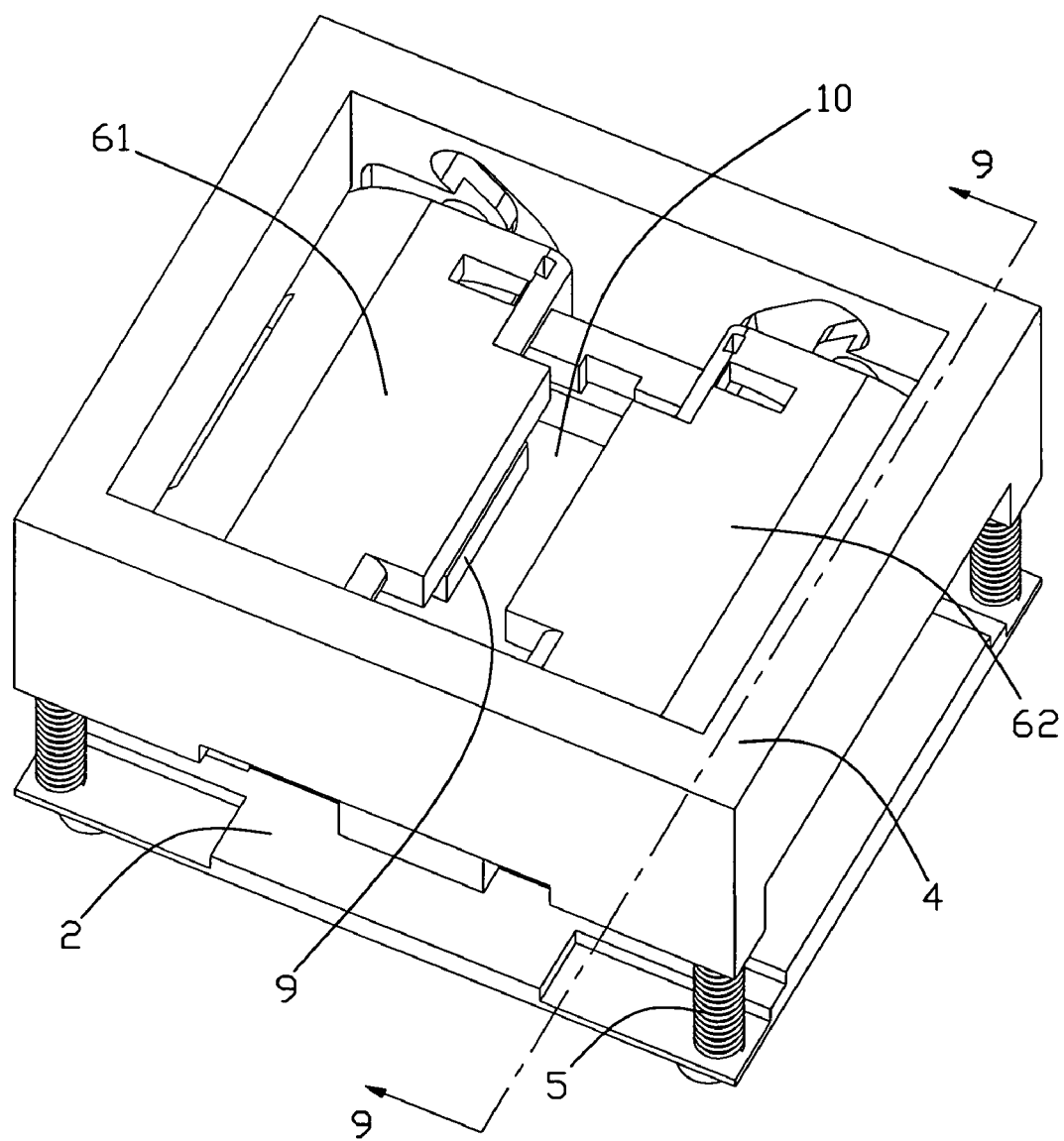
FIG. 8 is another assembled, perspective view of the socket in accordance with an embodiment of the present invention, wherein the latching members are at an close position.
Figure 9:
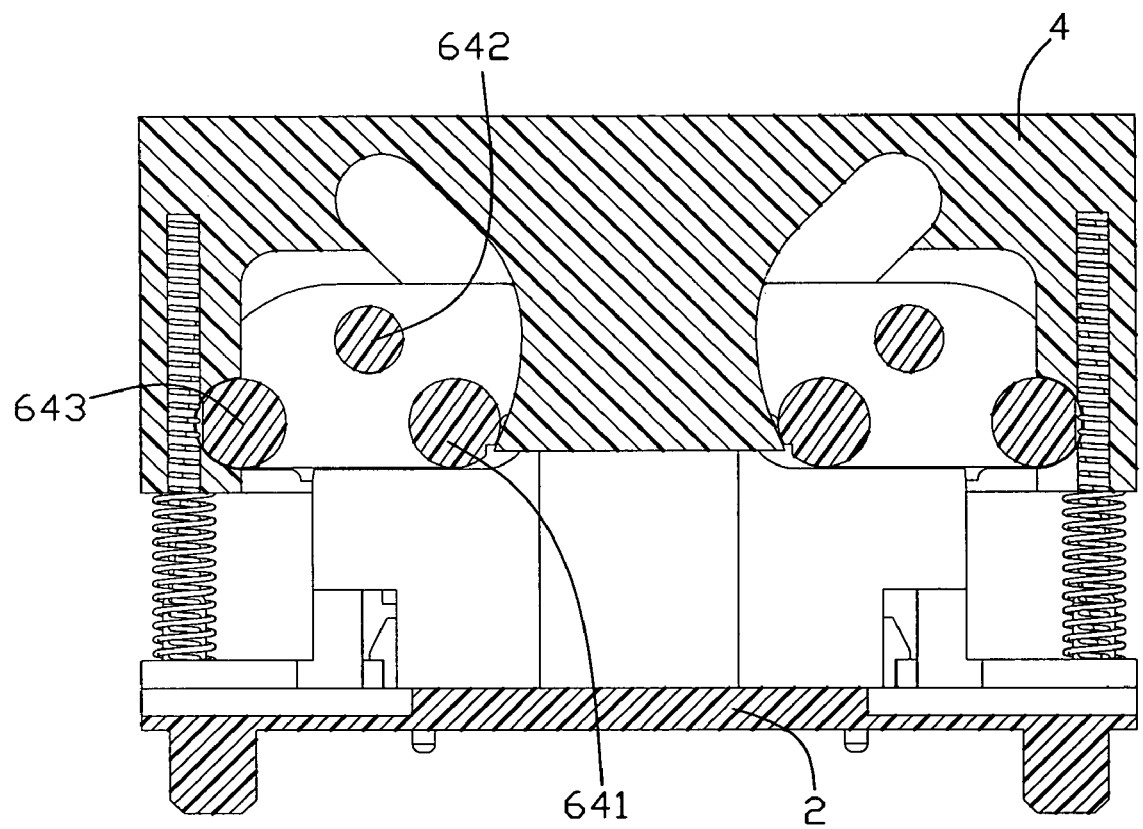
FIG. 9 is an section view, taken along line 9-9 in FIG. 8.

Referring to FIGS. 3 to 5, the cover 4 has a frame configure and comprises a pair of first sides 41 and a pair of second sides 42 adjacent to the first sides 41. The cover 4 has a receiving space 40 which is surrounded by the first sides 41 and the second sides 42 and a plurality of receiving holes (not shown) for receiving the springs 5, which upwardly urge the cover 4. Each first side 41 has a plurality of grooves divided in two groups on an inner side surface thereof, the grooves in each group having different depths and comprises a first groove 411, a second groove 412 and a third groove 413, both of the second groove 412 and the third groove 413 communicate with the first groove 411. Wherein the first groove 411 has an arc figure.

The latching equipment 6 is accommodated in the receiving space 40 of the cover 4 and comprises a first latching member 61, a second latching member 62, a pair of springs 69, a pair of pressing fingers 9 and a pair of short springs 96. Each of the first and the second latching members 61, 62 has a body 60 on a center part thereof and two extending portions 64 on two opposed ends of the body 60. Each extending portion 64 is formed with a plurality of outwardly protruding pivots which comprise a first pivot 641, a second pivot 642 and a third pivot 643. The first pivot 641 inserts into the first groove 411, the second pivot 642 inserts into the second groove 412 and the third pivot 643 inserts into the third groove 41. Following a movement of the cover 4 in the top-to-bottom direction, the pivots 641, 642, 643 respectively moves along the corresponding grooves 411, 412, 413. Each spring 69 links one extending portions 64 of the first latching member 61 and an opposed extending portion 64 of the second latching member 62. The body 60 has a locking portion 66 on an inner sidewall thereof toward to the center part of the receiving space 40 of the cover 4, the locking portion 66 comprises a retaining clump 660 and two locking arms 661 sandwiching the retaining clump 660. The pressing fingers 9 are respectively assembled to the locking portions 66, and each pressing finger 9 has a smooth top surface 90, two through latching holes 92 for engaging with the locking arms 661, a retaining slot 94 for receiving the retaining clump 660 and a latching slot 98 communicating with the retaining slot 94 and being used for receiving the spring 96.

When assembly, firstly, the springs 96 are put in the latching slots 98, then the pressing fingers 9 are respectively assembled to the locking portions 66 of the first and the second latching members 61, 62, the springs 69 attach to the extending portions 64 of the first and the second latching members 61, 62. After that, the assembled latching equipment 6 is put in the receiving space 40 of the cover 4, with the first, the second and the third pivots 641, 642, 643 respectively received in the first, the second and the third grooves 411, 412, 413. Following, the floating board 3 is put in the center part 222 of the insulating base 2, the springs 5 are located on the insulating base 2. Finally, the cover 4, together with the latching equipment 6, covers the insulating base 2 and the springs 5 are received in the receiving holes (not shown) of the cover 4.

Referring to FIGS. 6 to 9, primitively, the latching members 61, 62 are at the close position and press the floating board 3, when using, the cover 4 is downwardly pressed to force the latching equipment 6, the pivots 641, 642, 643 of the first latching member 61 and the second member 62 begin to slide along the grooves 411, 412, 413 of the cover 4, since the first groove 411 has an arc figure, the bodies 60 of the latching members 61, 62 will rotate to a vertical direction, that means the latching members 61, 62 moves from the close position to the open position, then the semiconductor package 10 is easily put in the supporting space 302 of the floating board 3, at this moment, the semiconductor package 10 does not electrically contact with the printed circuit board. Then, the cover 4 is loosed and upwardly moves by elastic forces of the springs 5, the pivots 641, 642, 643 move back along the grooves 411, 412, 413, synchronously, the springs 69 linking the first and the second latching members 61, 62 drive the first and the second latching members 61, 62 to rotate from the vertical direction to a horizontal direction till the latching members 61, 62 return to the close position. At the close position, the pressing fingers 9 of the latching equipment 6 downwardly press the floating board 3 to make the floating board 3 and the semiconductor package 10 go down, therefore the semiconductor package 10 electrically contacts with the printed circuit board. The socket 1 has a simple configuration and few elements, and provides a reliably electrically connecting path between the semiconductor package and the printed circuit board.

It is should be point out that the numbers of pivots on each extending portion 64 of each latching members 61, 62 may be changed, according to actually need, correspondingly, the number of grooves should be changed, and the grooves 411, 412, 413 may has a same depth.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket comprising:
    an insulating base receiving a plurality of contacts;
    a cover mounted to the insulating base, the cover being movable in a top-to-bottom direction relative to the insulating base and defining at least one arc groove;
    a latching equipment movably assembled to the cover and defining an open position and a close position relative to the insulating base, the latching equipment having at least one pivot, when the cover moving downwardly, the pivot sliding along the arc groove of the cover to make the latching equipment rotate from the close position to the open position; wherein
    when the cover moves upwardly to an original position, the pivot slides back along the groove and the latching equipment returns to the close position; wherein
    the latching equipment has a pair of opposed latching members which are linked by springs; further comprising a floating board assembled to the insulating base to support a semiconductor package; wherein
    at least one groove of the cover is three grooves defined on an inner side surface of the cover, correspondingly, the latching member has three pivots respectively engaging with the grooves.

2. A socket as described in claim 1, wherein the grooves have different depths.

3. A socket as described in claim 2, wherein the latching member has a body and a pair of extending portions on two opposed ends of the body, which is formed with the pivots.

4. A socket as described in claim 3, wherein the latching equipment has two pressing fingers which are assembled to the bodies of the latching members and press a semiconductor package when the latching equipment is at the close position.

5. A socket as described in claim 4, wherein the body has a locking portion which has a retaining clump and two locking arms sandwiching the retaining clump, and the pressing finger comprises two through latching holes for engaging with the locking arms and a retaining slot for receiving the retaining clump.

6. A socket as described in claim 5, wherein the pressing finger has a latching slot communicates with the retaining slot for receiving a spring.

7. A socket comprising:
an insulative base;
a plurality of contacts associated with the base;
a cover up and down moveable relative to the base;
a latching equipment pivotally assembled to the cover;
four first resilient devices extending vertically and constantly urging the cover upwardly away from the base toward an upper position;
a pair of second resilient devices extending horizontally and constantly urging the latching equipment toward a closed position where said cover is essentially located at said upper position; wherein
each of said first resilient devices is installed on the base and essentially a compressive spring during use while each of said second resilient devices is installed on the latching equipment and essentially an extensive spring during use; wherein
one of the cover and the latching equipment is provided with an arc groove and the other of the cover and the latching equipment is provided with a pivot engaged within said arc groove so as to guide pivotal movement of the latching equipment with regard to the cover.

* * * * *